United States Patent
Li et al.

(10) Patent No.: US 10,962,178 B2
(45) Date of Patent: Mar. 30, 2021

(54) DEVICE AND METHOD FOR PRESSURE-MOLDING ANTI-OVERHEATING CSP FLUORESCENT MEMBRANE

(71) Applicant: SOUTH CHINA UNIVERSITY OF TECHNOLOGY, Guangdong (CN)

(72) Inventors: Zongtao Li, Guangdong (CN); Qinghong Lin, Guangdong (CN); Yong Tang, Guangdong (CN); Shudong Yu, Guangdong (CN); Huiyu Wang, Guangdong (CN); Guanwei Liang, Guangdong (CN); Longsheng Lu, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 0 days.

(21) Appl. No.: 16/349,589

(22) PCT Filed: Dec. 1, 2017

(86) PCT No.: PCT/CN2017/114151
§ 371 (c)(1),
(2) Date: May 13, 2019

(87) PCT Pub. No.: WO2018/086631
PCT Pub. Date: May 17, 2018

(65) Prior Publication Data
US 2019/0277457 A1    Sep. 12, 2019

(30) Foreign Application Priority Data

Nov. 11, 2016  (CN) .......................... 201610995217.X (51) Int. Cl.
*H01L 21/687*   (2006.01)
*F21K 9/90*     (2016.01)
(Continued)

(52) U.S. Cl.
CPC ............... *F21K 9/90* (2013.01); *F21K 99/00* (2013.01); *H01L 21/68785* (2013.01);
(Continued)

(58) Field of Classification Search
CPC ............ H01L 33/48; H01L 2933/0041; H01L 21/68785; H01L 33/505; F21K 9/90
See application file for complete search history.

(56) References Cited

U.S. PATENT DOCUMENTS

| 2007/0216021 | A1* | 9/2007 | Morita | ................. H01L 23/296 |
| | | | | 257/701 |
| 2011/0233821 | A1* | 9/2011 | Bandoh | .................. B29C 48/08 |
| | | | | 264/272.11 |
| 2016/0276546 | A1* | 9/2016 | Lee | ........................ H01L 21/78 |

FOREIGN PATENT DOCUMENTS

| CN | 101027786 | 8/2007 |
| CN | 103311416 | 9/2013 |

(Continued)

OTHER PUBLICATIONS

"International Search Report (Form PCT/ISA/210)", dated Feb. 24, 2018, with English translation thereof, pp. 1-4.

*Primary Examiner* — Thanh Y. Tran
(74) *Attorney, Agent, or Firm* — JCIPRNET (57) ABSTRACT

Disclosed are a device and a method for pressure-molding an anti-overheating CSP fluorescent membrane. The device comprises a frame, a mould pressing device, a force measuring device, a control device and a feeding device; and the mould pressing device comprises an upper pressing mould, an upper clamp, a lower pressing mould, a guide post, an elastic supporting structure, and a lower clamp. As the stage of pressing the elastic supporting structure is added to the course of pressure molding, a mould clamping force of the pressure molding increases in a relatively steady way, and a force impact of a mould clamping device is reduced, thereby (Continued)

easily determining an initial point for maintain temperature of the pressure molding. The present invention effectively prevents overheating caused by long-term and large-area contact between the lower clamp and the heating lower pressing mould, and avoids the process defect of premature melting of the fluorescent membrane due to overheating, thereby greatly improving the product consistency and yield rate of the CSP-package fluorescent membrane in the pressure molding process.

5 Claims, 6 Drawing Sheets

(51) Int. Cl.
    *F21K 99/00*     (2016.01)
    *H01L 33/48*     (2010.01)
    *H01L 33/50*     (2010.01)

(52) U.S. Cl.
    CPC ............ *H01L 33/48* (2013.01); *H01L 33/505* (2013.01); *H01L 2933/0041* (2013.01)

(56) References Cited

FOREIGN PATENT DOCUMENTS

| | | |
|---|---|---|
| CN | 205141002 | 4/2016 |
| CN | 106449513 | 2/2017 |
| CN | 206225346 | 6/2017 |
| JP | 2012111202 | 6/2012 |

\* cited by examiner

DEVICE AND METHOD FOR PRESSURE-MOLDING ANTI-OVERHEATING CSP FLUORESCENT MEMBRANE

CROSS-REFERENCE TO RELATED APPLICATION

This application is a 371 application of the international PCT application serial no. PCT/CN2017/114151, filed on Dec. 1, 2017, which claims the priority benefit of China application no. 201610995217.X, filed on Nov. 11 2016. The entirety of each of the abovementioned patent applications is hereby incorporated by reference herein and made a part of this specification.

TECHNICAL FIELD

The present invention relates to the field of LED packaging technologies, and more particularly, to a device and a method for pressure-molding an anti-overheating CSP fluorescent membrane.

DESCRIPTION OF RELATED ART

With the LED technologies developed and cost controlled, the packaging volume of a LED device is getting smaller and smaller, and a power density thereof is continuously increasing. A Chip Scale Package (CSP) device can eliminate gold wires, requires an extremely small substrate or even does not need a substrate, so that the device size is greatly reduced, and the package cost is decreased by up to 20% in the meanwhile. In addition, the thermal resistance of the CSP device is also reduced, the light-emitting density of the CSP is improved, and the small size, thin depth and light weight characteristics of the CSP greatly enhance the design and application flexibility thereof. Therefore, CSP package is widely used in different fields, and a market demand thereof is growing rapidly.

Currently, CSP phosphor coating methods include wafer-level coating, dispensing, spraying, fluorescent resin molding, and fluorescent membrane pressure molding. The dispensing method implements molding by the constraint of a surface tension of the fluorescent resin itself, and is not adopted by CSP manufacturers basically since the consistency and uniformity thereof are poor. Currently, the commonly used processes mainly include spraying, fluorescent resin molding and fluorescent membrane pressure molding. In particular, the fluorescent membrane pressure molding is commonly used in the industry due to the consistency and uniformity thereof.

In the phosphor coating process for the CSP devices, the fluorescent membrane pressure-molding process needs to be realized by a pressure molding equipment. Because the CSP device has the characteristics of multi-facet luminescence and small volume, the thickness consistency of a packaging colloid needs to be very high. Therefore, the molding process has strict requirements on temperature control and operators. At current, domestic CSP manufacturers have a low degree of automation in this process, mainly relying on manpower to clamp, load and unload the LED chip, and adjust the fluorescent membrane. In this production process, there is often a process defect that the fluorescent membrane melts and flows due to overheating when the fluorescent membrane is not moulded. This is because that it takes too long for the operator to load and unload materials and adjust the fluorescent membrane, causing a clamp body to contact with a heating lower mould for a long time and overheat, and causing the fluorescent membrane to overheat for a long time and melt prematurely. This greatly reduces the yield rate and increases the production costs.

Aiming at the process defects to be urgently solved in the production, the present invention provides a device and a method for pressure-molding an anti-overheating CSP fluorescent membrane, which solves the technical problems of overheating of the clamp body and premature melting of the fluorescent membrane caused by the differences of operating time of the operators.

SUMMARY

An object of the present invention is to provide a device and a method for pressure-molding an anti-overheating CSP fluorescent membrane to overcome the above defects and deficiencies of the prior art.

In the CSP fluorescent membrane pressure-molding process, the operating time for placing the LED chips and the fluorescent membrane is uncontrollable, which easily leads to overheating due to large-area and long-time contact between the lower clamp and the heating lower pressing mould, and causes the fluorescent diaphragm to melt and flow prematurely when the moulds are not clamped, thus reducing the yield rate. The present invention can effectively prevent such package defects, reduce the dependence of the pressure-molding process on the operation proficiency, and greatly improve the yield rate.

A device for pressure-molding an anti-overheating CSP fluorescent membrane comprises a frame, a mould pressing device, a force measuring device, a control device and a feeding device; the mould pressing device is disposed in the frame, and the force measuring device is disposed at a bottom of the mould pressing device; the control device and the feeding device are disposed outside the frame; the force measuring device is implemented by using a force sensor and a capture card; the feeding device is implemented by a motor screw drive, a pneumatic drive or a hydraulic drive; and the control device is implemented by a closed loop servo-control system and an industrial computer.

The mould pressing device comprises an upper pressing mould, an upper clamp, a lower pressing mould, a guide post, an elastic supporting structure, and a lower clamp;

the upper pressing mould comprises an upper pressing mould body and an upper pressing mould heating device; the lower pressing mould comprises a lower pressing mould body and a lower pressing mould heating device; the upper pressing mould heating device is disposed in the upper pressing mould body, and heats the upper pressing mould body during pressure molding; and the lower pressing mould heating device is disposed in the lower pressing mould body, and heats the lower pressing mould body during pressure molding;

the upper clamp is fixed in a lateral surface of the upper pressing mould body close to the lower clamp; the lower clamp and the lower pressing mould body are connected by the elastic supporting structure; when the moulds are not clamped, the elastic supporting structure is not subjected to a mould clamping force, and a bottom surface of the lower clamp is separated from an upper surface of the lower pressing mould body; when the moulds are clamped, the elastic supporting structure is subjected to the mould clamping force, and shrinks and deforms, so that the bottom surface of the lower clamp is contacted with the upper surface of the lower pressing mould body; and the upper surface of the lower clamp is a smooth surface; and the upper pressing mould and the lower pressing mould are mounted at the guide post, and by means of controlling the feeding device, the upper pressing mould or the lower pressing mould moves on the guide post and the clamped or separated moulds are precisely positioned; and when the moulds are not clamped, the upper pressing mould and the lower pressing mould are in a separated state.

Further, the upper clamp and the lower clamp are precisely positioned by correspondingly complementary inclined planes at two ends of the clamps or by mounting the two ends of the clamps in minitype guide posts; and the force measuring device is used to measure the mould clamping force when the moulds are clamped.

Further, the bottom surface of the lower clamp is separated from the upper surface of the lower pressing mould body by 1-10 mm when the moulds are not clamped; a contact area of the bottom surface of the lower clamp and the upper surface of the lower pressing mould body is greater than 90% of an area of a lower bottom surface of the lower clamp when the moulds are clamped.

Further, contact of the elastic supporting structure connected to the lower clamp is point contact or line contact, and a contact area is no more than 5% of an area of the upper surface of the lower pressing mould body lower clamp; and contact of the elastic supporting structure connected to the lower pressing mould body is point contact or line contact, and a contact area is no more than 5% of the area of the upper surface of the lower pressing mould body.

Further, the elastic supporting structure is a helical spring, a spring leaf, an element having elasticity or a device having elasticity; the elastic supporting structure a stiffness of more than 1000 N/cm perpendicular to a pressure-molding direction, and a stiffness of 10-25 N/cm along the pressure-molding direction, and change values of the stiffness in the two directions do not exceed 5% when a temperature change range is less than 120° C.

A method for pressure-molding an anti-overheating CSP fluorescent membrane based on the device according to any of the devices above, comprises the steps of:

(1) starting the upper pressing mould heating device and the lower pressing mould heating device to preheat the upper pressing mould body and the lower pressing mould body;

(2) clamping a LED chip into the upper surface of the lower clamp and placing a fluorescent membrane above the LED chip at the same time;

(3) controlling, by the feeding device, only the upper pressing mould to move downward or only the lower pressing mould to move upward, so that the upper pressing mould and the lower pressing mould get close to each other, and measuring, by the force measuring device, a mould clamping force in real time;

(4) maintaining a mould clamping state, the upper clamp getting close to the lower clamp, the upper clamp being contacted with the fluorescent membrane, and starting squeezing the lower clamp, the mould clamping force measured in real time having a first inflection point, the elastic supporting structure being constantly compressed, and the bottom surface of the lower clamp getting constantly close to the upper surface of the heating lower pressing mould body; pressurizing the feeding device until the bottom surface of the lower clamp is contacted with the upper surface of the heating lower pressing mould body, and the mould clamping force measured in real time has a second inflection point, warming up the upper pressing mould body and the lower pressing mould body simultaneously through the heating devices, and maintaining the temperature and pressure; and (5) controlling by the feeding device, the upper pressing mould and the lower pressing mould to separate, and taking down the moulded LED chip to complete pressure molding.

Further, in the step (1), the preheating is to preheat to and maintain the temperature at 78-82° C.

Further, in the step (3), a feeding speed for only the upper pressing mould to move downward or only the lower pressing mould to move upward is controlled as 5-10 cm/s.

Further, the mould clamping force measured by the force measuring device in real time has two inflection points, and a stage from mould clamping to the first inflection point is an air compressing stage; a stage from the first inflection point to the second inflection point is a stage of pressure-molding the elastic supporting structure; a stage from the second inflection point to the end of pressure molding is a stage of pressure-molding the fluorescent membrane; and the second inflection point is an initial point for warming, and the temperature after warming is a temperature for the fluorescent membrane to melt and flow.

Further, in the step (4), the pressurizing is to pressurize the pressure to 1000-2000 Pa; the warming is to warm the temperature to 118-122° C.; and the maintaining the temperature and pressure lasts for 2-3 minutes.

Compared with the prior art, the present invention has the following advantages and effects.

(1) When the present invention is used to fix the LED chip and place the fluorescent membrane, a temperature of a clamp body for the LED clip is easily controlled, which prevents overheating due to long-term contact with a heat source, and can effectively prevent the fluorescent membrane from flowing prematurely, thereby reducing the operation difficulty of the procedure, and improving the yield rate of the procedure.

(2) The elastic supporting structure of the device according to the present invention has an anti-overheating function, increases the operation time for fixing the LED chip and adjusting the fluorescent membrane, increases the operability of the process, and reduces the training cost of the operator.

(3) The present invention is added with the stage of compressing the elastic supporting structure, so that the clamping force of the pressure molding increases with a relatively smooth growth, reduces the force impact of the mould clamping device, reduces the impact wear of the device, and improves the service life of the pressure-molding device.

(4) By compressing the elastic supporting structure and pressure-molding the fluorescent membrane according to the present invention, a first derivative of the mould clamping force measured by the force measuring device to time has obvious mutations, which is beneficial for determining the initial point for pressure-molding the fluorescent membrane, and facilitating selecting the initial point for warming the moulds and controlling the thermal insulation time control, thus improving the pressure-molding quality and yield rate of the procedure.

DESCRIPTION OF THE EMBODIMENTS

The invention will be further described in detail hereinafter with reference to the specific embodiments, but the invention is not limited to the following embodiments.

Figure 1:
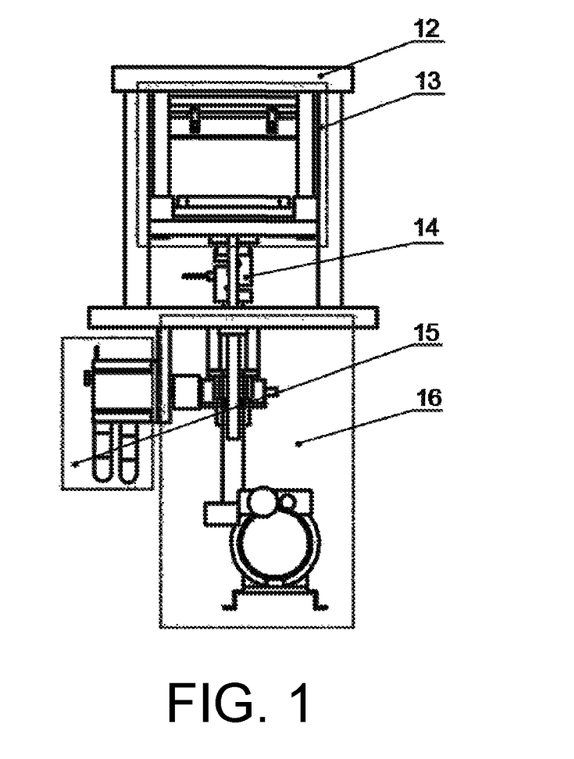
FIG. 1 is a schematic diagram of a device for pressure-molding an anti-overheating CSP fluorescent membrane of the present invention.

FIG. 1 is a schematic diagram of a device for pressure-molding an anti-overheating CSP fluorescent membrane according to the present invention, comprising a frame 12, a mould pressing device 13, a force measuring device 14, a control device 15 and a feeding device 16. The mould pressing device 13 is disposed in the frame 12, the force measuring device 14 is disposed at a bottom of the mould pressing device 13, and the force measuring device 14 is used to measure a clamping force when the moulds are clamped. The control device 15 and the feeding device 16 are disposed outside the frame 12; the force measuring device 14 is implemented by using a force sensor and a capture card; the feeding device 16 is implemented by a motor screw drive, a pneumatic drive or a hydraulic drive; and the control device 15 is implemented by a closed loop servo-control system and an industrial computer.

Figure 2:
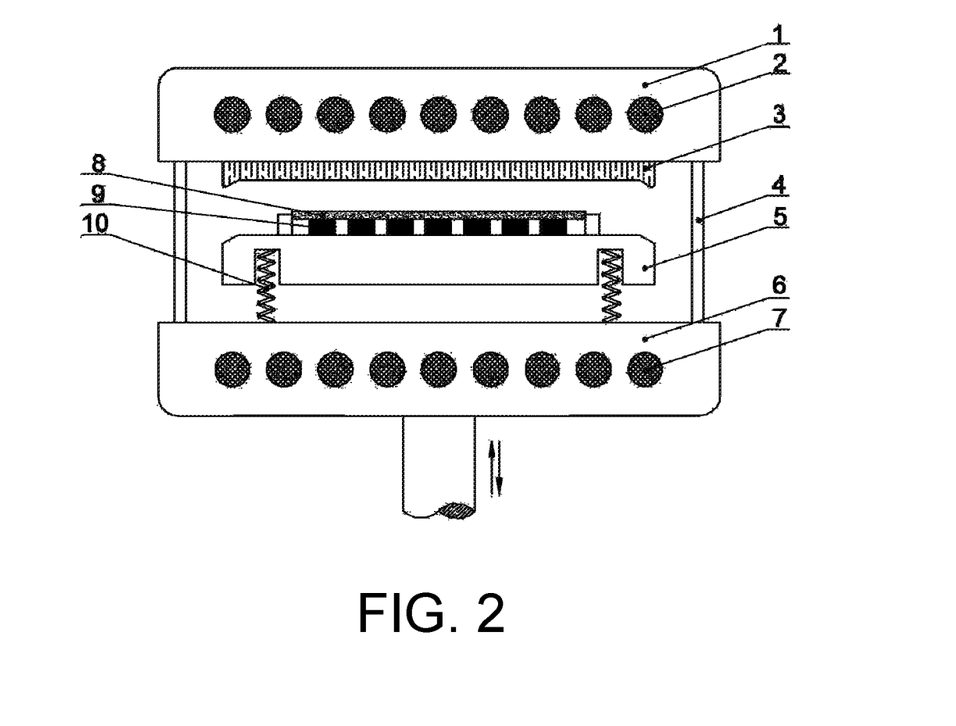
FIG. 2 is a schematic diagram illustrating a mould pressing device clamped with an LED chip and a fluorescent membrane in the device of the present invention.

The mould pressing device 13 comprises an upper pressing mould, an upper clamp 3, a lower pressing mould, a guide post 4, an elastic supporting structure 10, and a lower clamp 5. FIG. 2 is a schematic diagram illustrating that the mould pressing device 13 is clamped with a LED chip 9 and a fluorescent membrane 8. The LED chip 9 is clamped into an upper surface of the lower clamp 5, and the fluorescent membrane 8 is placed above the LED chip 9.

The upper pressing mould comprises an upper pressing mould body 1 and an upper pressing mould heating device 2. The lower pressing mould comprises a lower pressing mould body 6 and a lower pressing mould heating device 7. The upper pressing mould heating device 2 is disposed in the upper pressing mould body 1, and heats the upper pressing mould body 1 during pressure molding. The lower pressing mould heating device 7 is disposed in the lower pressing mould body 6, and heats the lower pressing mould body 6 during pressure molding.

The upper clamp 3 is fixed in a lateral surface of the upper pressing mould body 1 close to the lower clamp 5. The lower clamp 5 and the lower pressing mould body 6 are connected by the elastic supporting structure 10. When the moulds are not clamped, the elastic supporting structure is not subjected to a mould clamping force, and a bottom surface of the lower clamp is separated from an upper surface of the lower pressing mould body 6. When the moulds are clamped, the elastic supporting structure is subjected to the mould clamping force, and shrinks and deforms, so that the bottom surface of the lower clamp is contacted with the upper surface of the lower pressing mould body 6. The upper surface of the lower clamp 5 is a smooth surface.

The upper pressing mould and the lower pressing mould are mounted at the guide post 4, and by means of controlling the feeding device, the upper pressing mould or the lower pressing mould moves on the guide post 4 and the clamped or separated moulds are precisely positioned. When the moulds are not clamped, the upper pressing mould and the lower pressing mould are in a separated state.

Figure 3A:
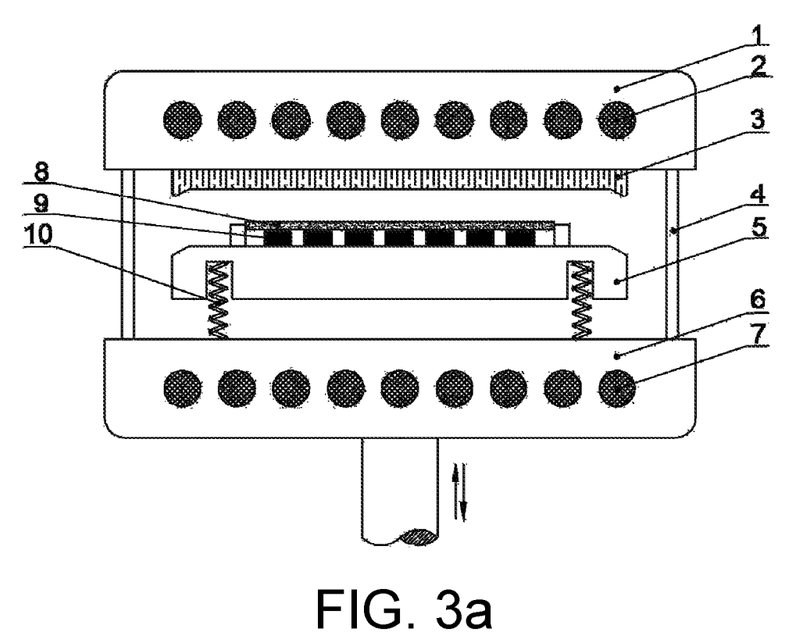
FIG. 3a is a schematic diagram illustrating that an upper clamp and a lower clamp in the device of the present invention are positioned by inclined planes at two ends of the clamps.
Figure 3B:
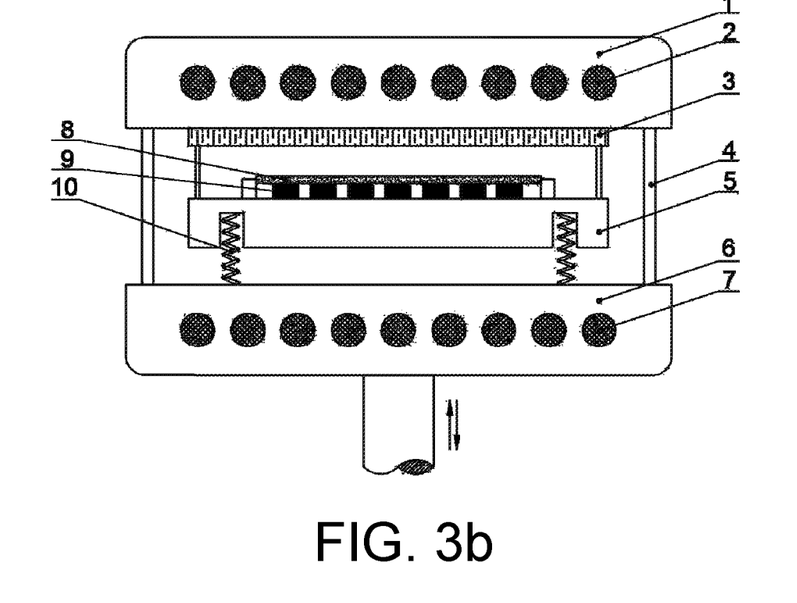
FIG. 3b is a schematic diagram illustrating that the upper clamp and the lower clamp in the device of the present invention are positioned by mounting the two ends of the clamps in minitype guide posts.
Figure 4A:
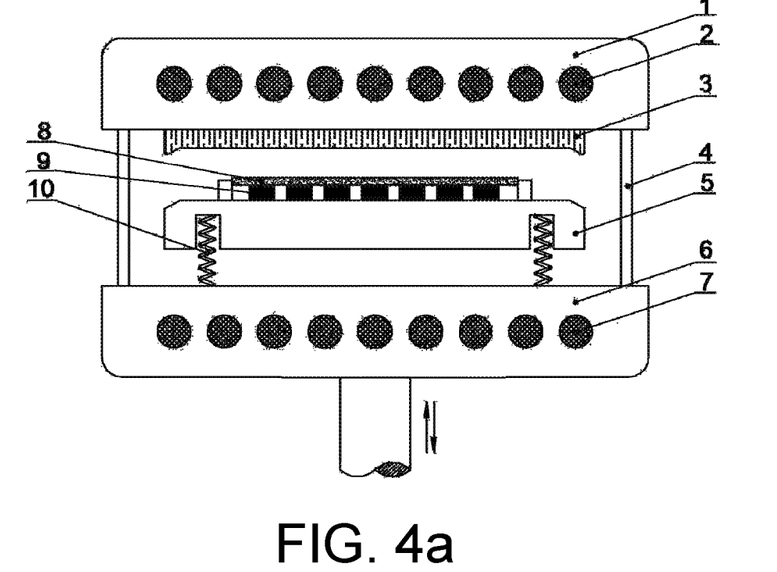
FIG. 4a is a schematic diagram illustrating that an elastic supporting structure in the device of the present invention is a spring.
Figure 4B:
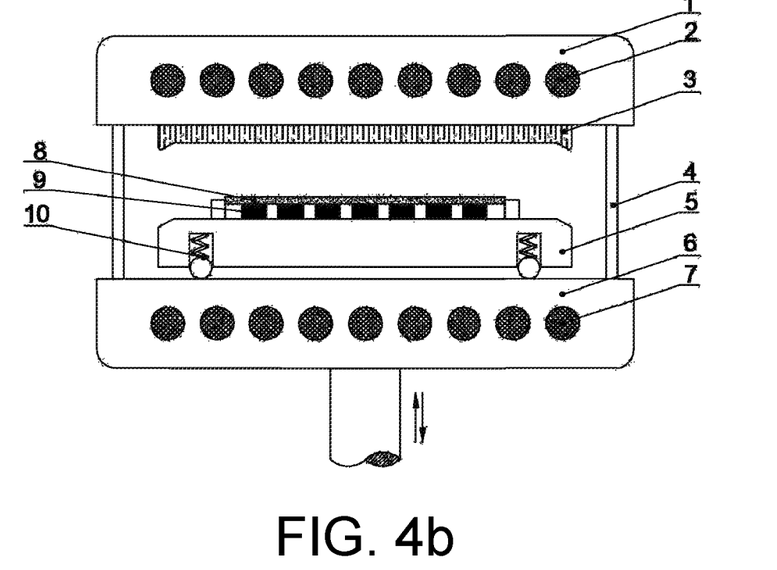
FIG. 4b is a schematic diagram illustrating that the elastic supporting structure in the device of the present invention is a spring slider.
Figure 4C:
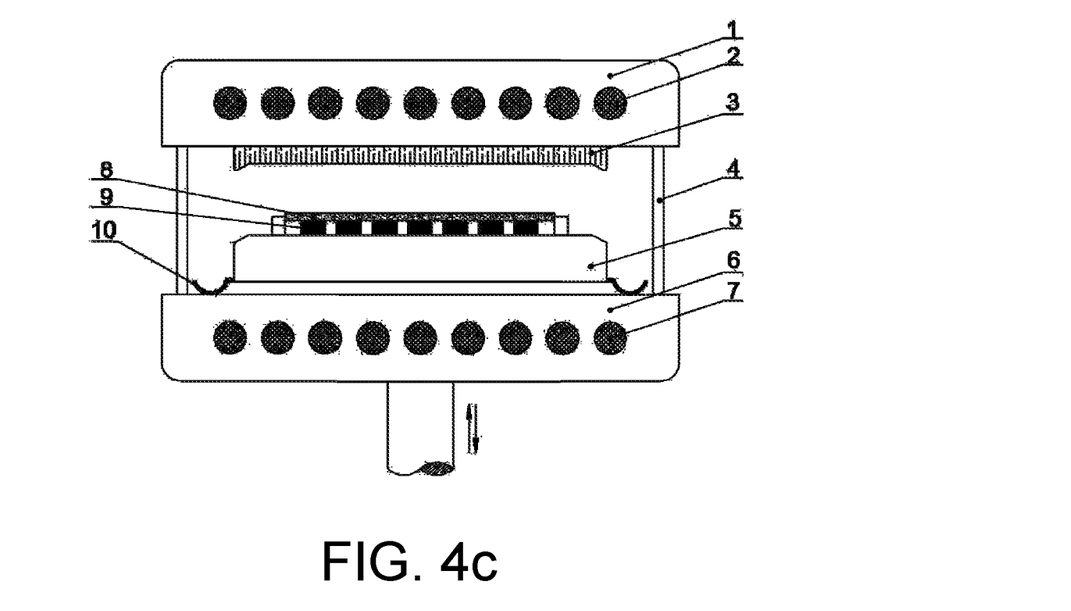
FIG. 4c is a schematic diagram illustrating that the elastic supporting structure in the device of the present invention is a curved plate spring.
Figure 4D:
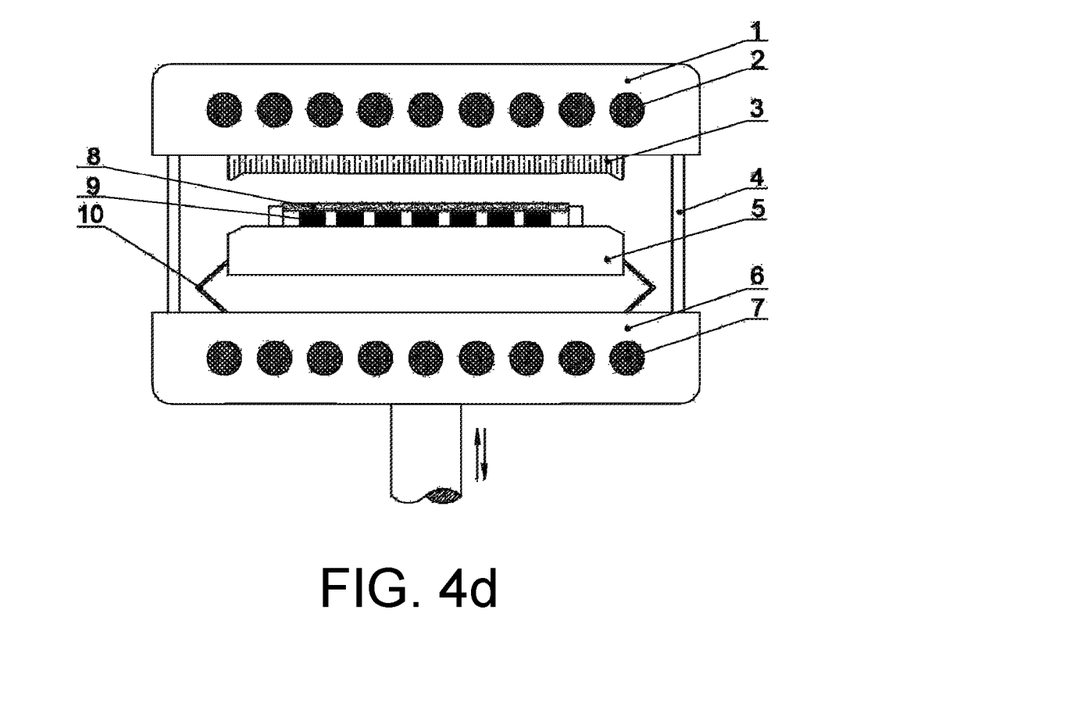
FIG. 4d is a schematic diagram illustrating that the elastic supporting structure in the device of the present invention is a folded plate spring.

The upper clamp 3 and the lower clamp 5 are precisely positioned by correspondingly complementary inclined planes at two ends of the clamps or by mounting the two ends of the clamps in minitype guide posts. FIG. 3a is a schematic diagram illustrating that the upper clamp and the lower clamp are positioned by the inclined planes at two ends of the clamps. FIG. 3b is a schematic diagram illustrating that the upper clamp and the lower clamp are positioned by mounting the two ends of the clamps in the minitype guide posts.

The bottom surface of the lower clamp 5 is separated from the upper surface of the lower pressing mould body 6 by 1-10 mm when the moulds are not clamped. A contact area of the bottom surface of the lower clamp and the upper surface of the lower pressing mould body 6 is greater than 90% of an area of a lower bottom surface of the lower clamp 5 when the moulds are clamped.

Contact of the elastic supporting structure 10 connected to the lower clamp 5 is point contact or line contact, and a contact area is no more than 5% of an area of the upper surface of the lower pressing mould body 6 lower clamp 5. Contact of the elastic supporting structure 10 connected to the lower pressing mould body 6 is point contact or line contact, and a contact area is no more than 5% of the area of the upper surface of the lower pressing mould body 6.

The elastic supporting structure 10 is a helical spring, a spring leaf, an element having elasticity or a device having elasticity. FIGS. 4a to 4d are schematic diagrams illustrating that the elastic supporting structure is a spring, a spring slider, a curved plate spring and a folded plate spring respectively. The elastic supporting structure 10 has a stiffness of more than 1000 N/cm perpendicular to a pressure-molding direction, and a stiffness of 10-25 N/cm along the pressure-molding direction, and change values of the stiffness in the two directions do not exceed 5% when a temperature change range is less than 120° C.

Embodiment 1

In the device used in this embodiment, an elastic supporting structure is a spring leaf, and the spring leaf has a stiffness of 10 N/cm along a pressure-molding direction. A contact of the spring leaf connected to a lower clamp 5 is line contact, and a contact area is 3% of an area of an upper surface of the lower clamp 5. A contact of the spring leaf connected to the lower pressing mould body 6 is line contact, and a contact area is 3% of the area of the upper surface of the lower pressing mould body 6. A contact area of the bottom surface of the lower clamp 5 and the upper surface of the lower pressing mould body 6 is greater than 95% of an area of a lower bottom surface of the lower clamp 5 when the moulds are clamped.

The device for pressure-molding an anti-overheating CSP fluorescent membrane described above is adopted to mould a CSP fluorescent membrane.

(1) Upper pressing mould and lower pressing mould heating devices are started to preheat the pressing moulds, and a temperature is maintained at 78° C.

(2) The upper clamp 3 and the lower clamp 5 are controlled to be separated by the feeding device 16, and the lower clamp 5 and the lower pressing mould body 6 are separated by 1 mm through the elastic supporting structure.

(3) A LED chip 9 is clamped into the upper surface of the lower clamp 5 and a fluorescent membrane 8 is placed above the LED chip 9 at the same time.

(4) The feeding device 16 controls only the upper pressing mould to move downward, so that the upper pressing mould and the lower pressing mould get close to each other, wherein a feeding speed for only the upper pressing mould to move downward is controlled as 5 cm/s; and meanwhile, the force measuring device 14 measures a mould clamping force in real time.

Figure 5A:
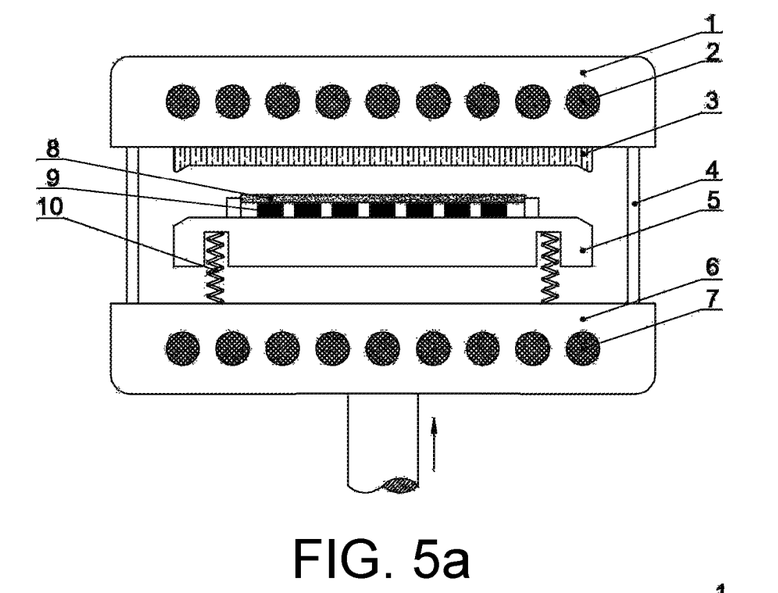
FIG. 5a is a schematic diagram illustrating an air compressing stage in the course of pressure molding of the device of the present invention.
Figure 5B:
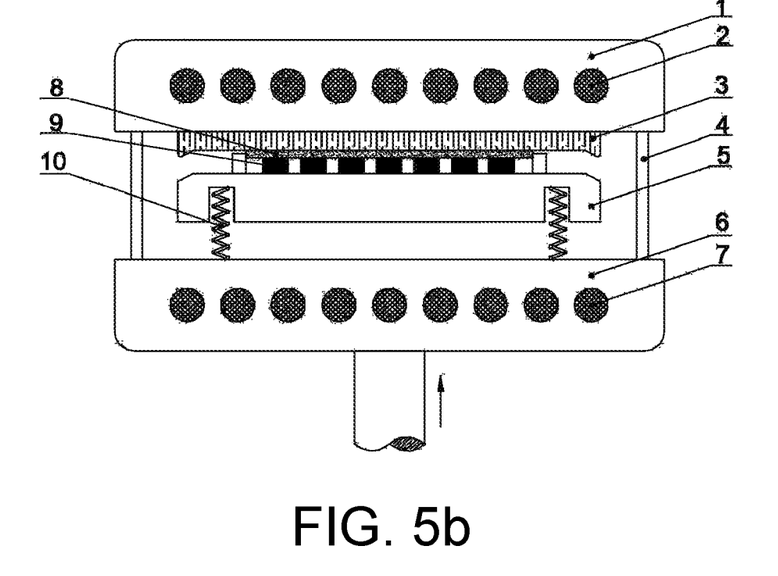
FIG. 5b is a schematic diagram illustrating a stage of pressure-molding the elastic supporting structure in the course of pressure molding of the device of the present invention.

(5) The upper clamp 3 gets close to the lower clamp 5, and a process is as shown in FIG. 5*a*. The upper clamp 3 is contacted with the fluorescent membrane 8, and starts squeezing the lower clamp 5, and a process is as shown in FIG. 5*b*. The mould clamping force has a first inflection point, the elastic supporting structure 10 is constantly compressed, and the bottom surface of the lower clamp 5 gets constantly close to the upper surface of the heating lower pressing mould body 6.

Figure 5C:
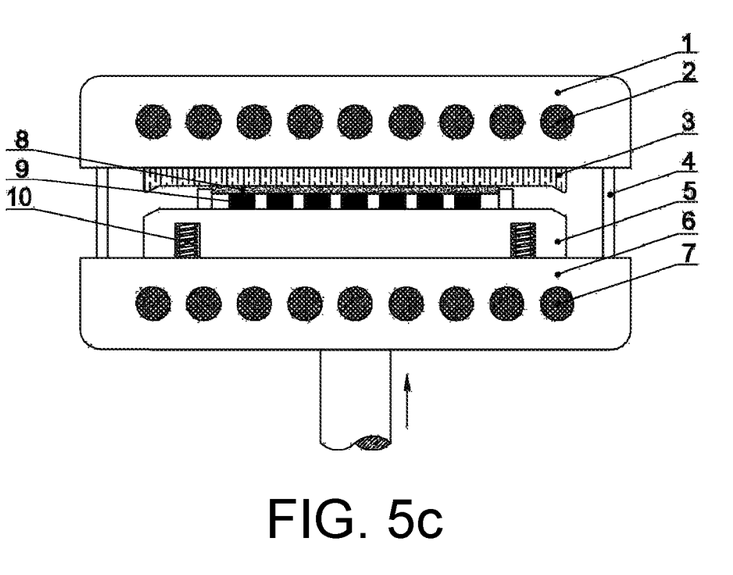
FIG. 5c is a schematic diagram illustrating a stage of pressure-molding the fluorescent membrane in the course of pressure molding of the device of the present invention.

(6) The bottom surface of the lower clamp 5 is contacted with the upper surface of the heating lower pressing mould body 6, and a process is as shown in FIG. 5*c*. The mould clamping force has a second inflection point, and the feeding device 16 is pressurized to 1000 Pa.

(7) When the second inflection point of the mould clamping force occurs, temperature of the upper pressing mould and the lower pressing mould is raised to 118° C., and the temperature and pressure are maintained for 2 minutes. The feeding device 16 controls the upper pressing mould and the lower pressing mould to separate and the moulded LED chip is taken down to complete the pressure molding procedure.

The CSP product with the fluorescent membrane obtained by pressure molding has uniform thickness, uniform phosphor concentration distribution, good spatial light color distribution, and no process defects caused by overheating of the fluorescent membrane.

Embodiment 2

In the device used in this embodiment, an elastic supporting structure is a spring leaf, and the spring leaf has a stiffness of 25 N/cm along a pressure-molding direction. A contact of the spring leaf connected to a lower clamp 5 is line contact, and a contact area is 5% of an area of an upper surface of the lower clamp 5. A contact of the spring leaf connected to the lower pressing mould body 6 is line contact, and a contact area is 5% of the area of the upper surface of the lower pressing mould body 6. A contact area of the bottom surface of the lower clamp 5 and the upper surface of the lower pressing mould body 6 is greater than 90% of an area of a lower bottom surface of the lower clamp 5 when the moulds are clamped.

The device for pressure-molding an anti-overheating CSP fluorescent membrane described above is adopted to mould a CSP fluorescent membrane.

(1) Upper pressing mould and lower pressing mould heating devices are started to preheat the pressing moulds, and a temperature is maintained at 82° C.

(2) The upper clamp 3 and the lower clamp 5 are controlled to be separated by the feeding device 16, and the lower clamp 5 and the lower pressing mould body 6 are separated by 10 mm through the elastic supporting structure.

(3) A LED chip 9 is clamped into the upper surface of the lower clamp 5 and a fluorescent membrane 8 is placed above the LED chip 9 at the same time.

(4) The feeding device 16 controls only the upper pressing mould to move downward, so that the upper pressing mould and the lower pressing mould get close to each other, wherein a feeding speed for only the upper pressing mould is controlled as 10 cm/s; and meanwhile, the force measuring device 14 measures a mould clamping force in real time.

(5) The upper clamp 3 is close to the lower clamp 5, and a process is as shown in FIG. 5*a*. The upper clamp 3 is contacted with the fluorescent membrane 8, and starts squeezing the lower clamp 5, and a process is as shown in FIG. 5*b*. The mould clamping force has a first inflection point, the elastic supporting structure 10 is constantly compressed, and the bottom surface of the lower clamp 5 is constantly close to the upper surface of the heating lower pressing mould body 6.

(6) The bottom surface of the lower clamp 5 is contacted with the upper surface of the heating lower pressing mould body 6, and a process is as shown in FIG. 5*c*. The mould clamping force has a second inflection point, and the feeding device 16 is pressurized to 2000 Pa.

(7) When the second inflection point of the mould clamping force occurs, temperature of the upper pressing mould and the lower pressing mould is raised to 122° C., and the temperature and pressure are maintained for 3 minutes. The feeding device 16 controls the upper pressing mould and the lower pressing mould to separate and the moulded LED chip is taken down to complete the pressure molding procedure.

The CSP product with the fluorescent membrane obtained by pressure molding has uniform thickness, uniform phosphor concentration distribution, good spatial light color distribution, and no process defects caused by overheating of the fluorescent membrane.

Embodiment 3

In the device used in this embodiment, an elastic supporting structure is a spring leaf, and the spring leaf has a stiffness of 20 N/cm along a pressure-molding direction. A contact of the spring leaf connected to a lower clamp 5 is line contact, and a contact area is 5% of an area of an upper surface of the lower clamp 5. A contact of the spring leaf connected to the lower pressing mould body 6 is line contact, and a contact area is 5% of the area of the upper surface of the lower pressing mould body 6. A contact area of the bottom surface of the lower clamp 5 and the upper surface of the lower pressing mould body 6 is greater than 93% of an area of a lower bottom surface of the lower clamp 5 when the moulds are clamped.

The device for pressure-molding an anti-overheating CSP fluorescent membrane described above is adopted to mould a CSP fluorescent membrane.

(1) Upper pressing mould and lower pressing mould heating devices are started to preheat the pressing moulds, and a temperature is maintained at 80° C.

(2) The upper clamp 3 and the lower clamp 5 are controlled to be separated by the feeding device 16, and the lower clamp 5 and the lower pressing mould body 6 are separated by 8 mm through the elastic supporting structure.

(3) A LED chip 9 is clamped into the upper surface of the lower clamp 5 and a fluorescent membrane 8 is placed above the LED chip 9 at the same time.

(4) The feeding device 16 controls only the lower pressing mould to move upward, so that the upper pressing mould and the lower pressing mould get close to each other, wherein a feeding speed for only the lower pressing mould is controlled as 8 cm/s; and meanwhile, the force measuring device 14 measures a mould clamping force in real time.

(5) The upper clamp 3 is close to the lower clamp 5, and a process is as shown in FIG. 5a. The upper clamp 3 is contacted with the fluorescent membrane 8, and starts squeezing the lower clamp 5, and a process is as shown in FIG. 5b. The mould clamping force has a first inflection point, the elastic supporting structure 10 is constantly compressed, and the bottom surface of the lower clamp 5 is constantly close to the upper surface of the heating lower pressing mould body 6.

(6) The bottom surface of the lower clamp 5 is contacted with the upper surface of the heating lower pressing mould body 6, and a process is as shown in FIG. 5c. The mould clamping force has a second inflection point, and the feeding device 16 is pressurized to 1800 Pa.

(7) When the second inflection point of the mould clamping force occurs, temperature of the upper pressing mould and the lower pressing mould is raised to 120° C., and the temperature and pressure are maintained for 3 minutes. The feeding device 16 controls the upper pressing mould and the lower pressing mould to separate and the moulded LED chip is taken down to complete the pressure molding procedure.

The CSP product with the fluorescent membrane obtained by pressure molding has uniform thickness, uniform phosphor concentration distribution, good spatial light color distribution, and no process defects caused by overheating of the fluorescent membrane.

The present invention can be preferably implemented as described above.

What is claimed is:

1. A method of a device for pressure-molding an anti-overheating CSP fluorescent membrane, the device including a lower pressing mould heating device (7), a force measuring device (14), a feeding device (16) and a mould pressing device (13), the mould pressing device (13) having an upper pressing mould, a lower pressing mould and a lower clamp (5), the upper pressing mould having an upper pressing mould body (1) and an upper pressing mould heating device (2), the lower pressing mould having a lower pressing mould body (6), the method comprising the steps of:

step 1: starting the upper pressing mould heating device (2) and the lower pressing mould heating device (7) to preheat the upper pressing mould body (1) and the lower pressing mould body (6);

step 2: clamping an LED chip into an upper surface of the lower clamp (5) and placing a fluorescent membrane above the LED chip at the same time;

step 3: controlling, by the feeding device (16), only the upper pressing mould to move downward or only the lower pressing mould to move upward, so that the upper pressing mould and the lower pressing mould get close to each other, and measuring, by the force measuring device (14), a mould clamping force in real time;

step 4: maintaining a mould clamping state, pressurizing the feeding device (16) until the mould clamping force measured in real time has a second inflection point, warming up the upper pressing mould body (1) and the lower pressing mould body (6) simultaneously through the heating devices, and maintaining the temperature and pressure; and step 5: controlling, by the feeding device (16), the upper pressing mould and the lower pressing mould to separate, and taking down the moulded LED chip to complete pressure molding.

2. The method for pressure-molding the anti-overheating CSP fluorescent membrane according to claim 1, wherein in the step 1, the preheating is to preheat and maintain the temperature at 78-82° C.

3. The method for pressure-molding the anti-overheating CSP fluorescent membrane according to claim 1, wherein in the step 3, a feeding speed for only the upper pressing mould to move downward or only the lower pressing mould to move upward is controlled as 5-10 cm/s.

4. The method for pressure-molding the anti-overheating CSP fluorescent membrane according to claim 1, wherein the mould clamping force measured by the force measuring device (14) in real time has two inflection points, and a stage from mould clamping to a first inflection point is an air compressing stage; a stage from the first inflection point to the second inflection point is a stage of pressure-molding an elastic supporting structure; a stage from the second inflection point to the end of pressure molding is a stage of pressure-molding the fluorescent membrane; and the second inflection point is an initial point for warming, and the temperature after warming is a temperature for the fluorescent membrane to melt and flow.

5. The method for pressure-molding the anti-overheating CSP fluorescent membrane according to claim 1, wherein in the step 4, the pressurizing is to pressurize the pressure to 1000-2000 Pa; the warming is to warm the temperature to 118-122° C.; and the maintaining the temperature and pressure lasts for 2-3 minutes.

\* \* \* \* \*